(12) United States Patent
Huang et al.

(10) Patent No.: US 11,201,110 B2
(45) Date of Patent: Dec. 14, 2021

(54) SEMICONDUCTOR DEVICE PACKAGE WITH CONDUCTIVE PILLARS AND METHOD FOR MANUFACTURING THE SAME

(71) Applicant: Advanced Semiconductor Engineering, Inc., Kaohsiung (TW)

(72) Inventors: Min Lung Huang, Kaohsiung (TW); Hung-Jung Tu, Kaohsiung (TW); Hsin Hsiang Wang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 41 days.

(21) Appl. No.: 16/528,350

(22) Filed: Jul. 31, 2019

(65) Prior Publication Data

US 2021/0035899 A1    Feb. 4, 2021

(51) Int. Cl.
*H01L 23/498* (2006.01)
*H01L 21/56* (2006.01)
*H01L 21/48* (2006.01)
*H01L 23/31* (2006.01)

(52) U.S. Cl.
CPC .... *H01L 23/49838* (2013.01); *H01L 21/4857* (2013.01); *H01L 21/563* (2013.01); *H01L 21/568* (2013.01); *H01L 23/3128* (2013.01); *H01L 23/49822* (2013.01)

(58) Field of Classification Search
CPC ........... H01L 23/49838; H01L 23/5226; H01L 21/4857
See application file for complete search history.

(56) References Cited

U.S. PATENT DOCUMENTS

| | | | |
|---|---|---|---|
| 2012/0139090 A1* | 6/2012 | Kim | H01L 25/105 257/659 |
| 2019/0378795 A1* | 12/2019 | Lee | H01L 24/92 |
| 2020/0035625 A1* | 1/2020 | Wang | H01Q 21/062 |
| 2020/0105653 A1* | 4/2020 | Elsherbini | H01L 23/645 |
| 2020/0105703 A1* | 4/2020 | Kim | H01L 24/96 |

* cited by examiner

*Primary Examiner* — Quoc D Hoang
(74) *Attorney, Agent, or Firm* — Foley & Lardner LLP

(57) ABSTRACT

A semiconductor device package includes a conductive layer, a first conductive pillar, a circuit layer and a second conductive pillar. The conductive layer has a first surface. The first conductive pillar is disposed on the first surface of the conductive layer. The circuit layer is disposed over the conductive layer. The circuit layer has a first surface facing the conductive layer. The second conductive pillar is disposed on the first surface of the circuit layer. The first conductive pillar is physically spaced apart from the second conductive pillar and electrically connected to the second conductive pillar.

16 Claims, 21 Drawing Sheets

SEMICONDUCTOR DEVICE PACKAGE WITH CONDUCTIVE PILLARS AND METHOD FOR MANUFACTURING THE SAME

BACKGROUND

1. Technical Field

The present disclosure relates generally to a semiconductor device package and a method of manufacturing the same. More particularly, the present disclosure relates to a semiconductor device package including conductive pillars and a method of manufacturing the same.

2. Description of the Related Art

Conductive pillars (e.g., copper pillars) are used in a semiconductor device package for electrical connections, and tall conductive pillars (e.g., having a height greater than 200 micrometer) are specified in many applications. However, forming a tall conductive pillar may encounter many issues. For example, to protect the conductive pillars, a molding compound may be formed to fully cover the conductive pillars, and a grinding process is carried out to remove a portion of the molding compound to expose the conductive pillars. However, the conductive pillars may be damaged during the manufacturing process.

In addition, in a comparative process to manufacture a semiconductor device package, a redistribution layer (RDL) is formed, conductive pillars and dies (or chips) are formed on the RDL, and then a molding compound is formed on the RDL to cover the conductive pillars and dies. Hence, if any one step of the manufacturing process fails, the entire semiconductor device package would be considered as failure as well, even if the dies function well. This would increase the manufacturing cost and reduce the yield rate.

SUMMARY

In one or more embodiments, a semiconductor device package includes a conductive layer, a first conductive pillar, a circuit layer and a second conductive pillar. The conductive layer has a first surface. The first conductive pillar is disposed on the first surface of the conductive layer. The circuit layer is disposed over the conductive layer. The circuit layer has a first surface facing the conductive layer. The second conductive pillar is disposed on the first surface of the circuit layer. The first conductive pillar is physically spaced apart from the second conductive pillar and electrically connected to the second conductive pillar.

In one or more embodiments, a semiconductor device package includes a circuit layer, an electronic component, a conductive element and a package body. The circuit layer has a first surface and a second surface opposite to the first surface. The electronic component is disposed on the first surface of the circuit layer. The conductive element is disposed on the first surface of the circuit layer. The package body is disposed on the first surface of the circuit layer and covers the conductive element. The package body has a cavity to accommodate the electronic component.

In one or more embodiments, a method for manufacturing a semiconductor device package includes (a) providing a first structure having a conductive layer and a first conductive pillar disposed on the conductive layer; (b) providing a second structure having a circuit layer and a second conductive pillar disposed on the circuit layer; and (c) connecting the first conductive pillar with the second conductive pillar through a conductive adhesion.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
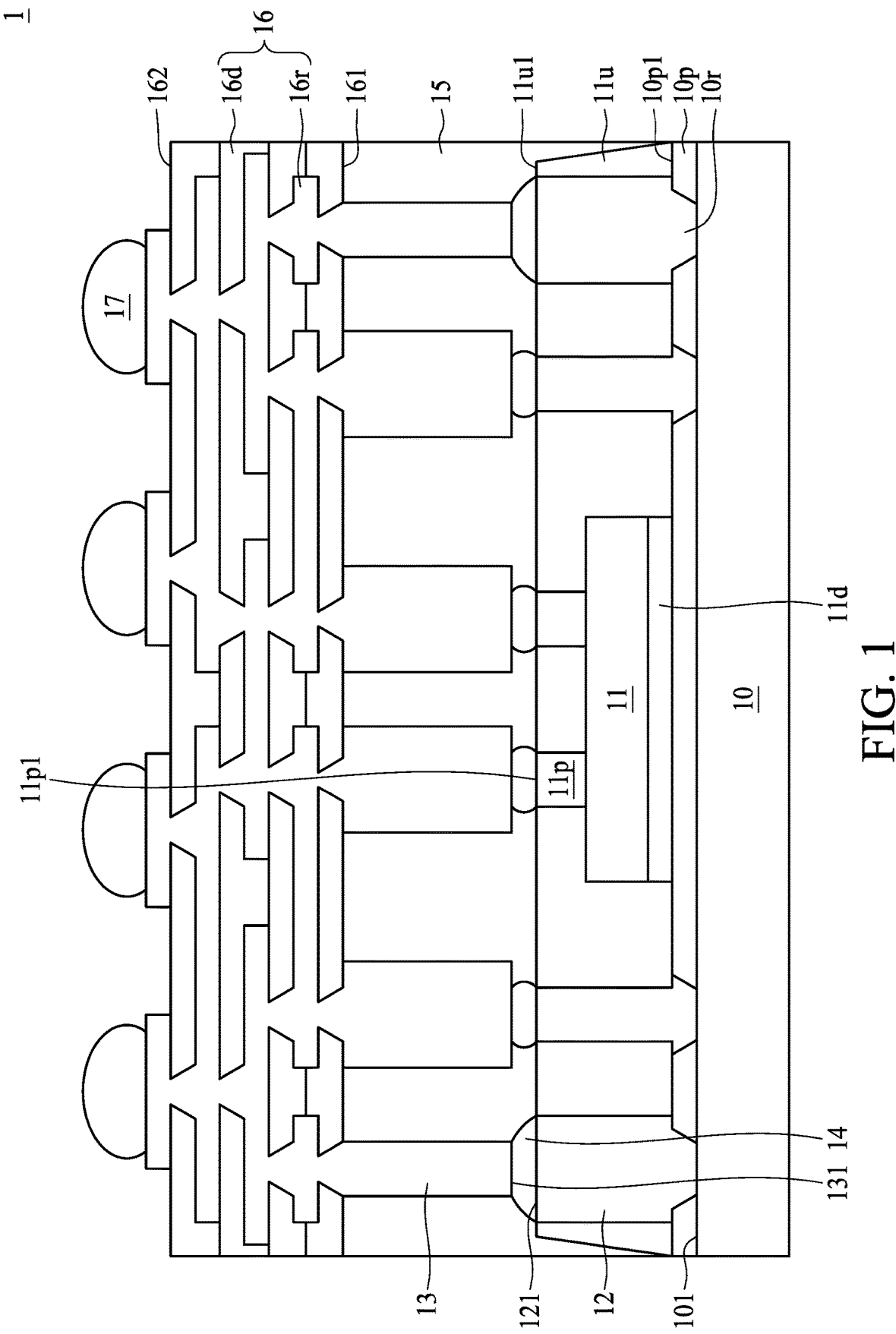
FIG. 1 illustrates a cross-sectional view of a semiconductor device package in accordance with some embodiments of the present disclosure.

Structures, manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments or examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor device package 1 in accordance with some embodiments of the present disclosure. The semiconductor device package 1 includes a carrier 10, an electronic component 11, conductive pillars 12, 13, a connection element 14, a package body 15, a circuit layer 16 and electrical contacts 17.

The carrier 10 has a passivation layer 10p and a conductive layer 10r disposed on its surface 101. In some embodiments, the passivation layer 10p includes silicon oxide, silicon nitride, gallium oxide, aluminum oxide, scandium oxide, zirconium oxide, lanthanum oxide or hafnium oxide. The conductive layer is, or includes, a conductive material such as a metal or metal alloy. Examples include gold (Au), silver (Ag), aluminum (Al), copper (Cu), or an alloy thereof. A portion of the conductive layer 10r is covered by the passivation layer 10p while the other portion of the conductive layer 10r is exposed from the passivation layer 10p for electrical connections.

The electronic component 11 is disposed on a surface 10p1 of the passivation layer 10p. The electronic component 11 has an active surface away from the carrier 10 and a backside surface facing the carrier 10. The backside surface of the electronic component 11 is attached to the passivation layer 10r through an adhesive layer 11d (e.g., Die Attach Film (DAF), Ajinomoto Build-up Film (ABF), epoxy, sintering or the like). One or more electrical contacts 11p (e.g., micro bump) are disposed on the active surface of the electronic component 11. The electronic component 11 may be a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The conductive pillars 12 are disposed on the surface 10p1 of the passivation layer 10p. The conductive pillars 12 is electrically connected to the conductive layer 10r exposed from the passivation layer 10p. In some embodiments, the conductive pillars 12 may include Cu. However, other conductive materials such as nickel (Ni) and/or Al or a combination of various metals or other conductive materials may also be used in the conductive pillars 12. In some embodiments, a height of the conductive pillars 12 is less than 200 micrometers.

In some embodiments, the conductive pillars 12 have the same diameter. Alternatively, the conductive pillars 12 may have different diameters. For example, a diameter of the conductive pillar 12 far away from the electronic component 11 is greater than a diameter of the conductive pillar 12 adjacent to the electronic component 11. For example, the diameter of the conductive pillar 12 far away from the electronic component 11 is less than the diameter of the conductive pillar 12 adjacent to the electronic component 11. In some embodiments, a surface 121 of each of the conductive pillars 12 and a surface 11p1 of each of the electrical contacts 11p are substantially coplanar (or at the same level). For example, a distance between the surface 121 of each of the conductive pillars 12 and the surface 10p1 of the passivation layer 10p is substantially the same as a distance between the surface 11p1 of each of the electrical contacts 12 and the surface 10p1 of the passivation layer 10p. In some embodiments, a pitch of the conductive pillars 12 adjacent to the electronic component 11 is greater than a pitch of the conductive pillars 12 far away from the electronic component 11.

The conductive pillars 13 are disposed on the surface 121 of the conductive pillars 12. The conductive pillars 13 are spaced apart from the conductive pillars 12. The conductive pillars 13 is aligned with the conductive pillars 12 and electrically connected to the conductive pillars 12 through the connection element 14. For example, each of the conductive pillars 13 has a surface 131 facing the surface 121 of the corresponding conductive pillar 12, and the surface 131 of the each of the conductive pillars 13 is connected to the surface 121 of the corresponding conductive pillar 12 through the connection element 14. In some embodiments, the connection element 14 is or includes electrically conductive materials, such as solder, conductive paste or the like. In some embodiments, the surfaces 131 of the conductive pillars 13 are substantially coplanar (or at the same level).

In some embodiments, the conductive pillars 13 have the same diameter. Alternatively, the conductive pillars 13 may have different diameters. In some embodiments, a diameter of the conductive pillar 13 is the same as the diameter of the corresponding conductive pillar 12 connected to the conductive pillar 13 (e.g., two connected conductive pillars have the same diameter). Alternatively, the conductive pillar 13 and the corresponding conductive pillar 12 connected to the conductive pillar 13 have different diameters. For example, a diameter of the conductive pillar 13 connected to the conductive pillar 12 having a relatively greater diameter is less than a diameter of the conductive pillar 13 connected to the conductive pillar 12 having a relative smaller diameter. In some embodiments, a pitch of the conductive pillars 13 adjacent to the center of the circuit layer 16 is greater than a pitch of the conductive pillars 13 adjacent to the edges of the circuit layer 16.

An underfill flu is disposed on the surface 10p1 of the passivation layer 10p. The underfill 11u covers or encapsulates the electronic component 11 and the conductive pillars 12. In some embodiments, a portion of the conductive pillars 12 is exposed from the underfill 10u for electrical connections. For example, the surface 121 of the conductive pillars 12 is exposed from the underfill 10u. For example, a surface 11u1 of the underfill 11u is substantially coplanar with the surface 121 of the conductive pillars 12. In some embodiments, the underfill flu includes an epoxy resin, a molding compound (e.g., an epoxy molding compound or other molding compound), a polyimide, a phenolic compound or material, a material including a silicone dispersed therein, or a combination thereof. In some embodiments, the underfill 11u does not include fillers.

The package body 15 is disposed on the surface 10p1 of the passivation layer 10p. The package body 15 covers or encapsulates the underfill 11u and the conductive pillars 13. In some embodiments, the underfill 11u may be omitted, and the package body 15 directly covers or encapsulates the electronic component 11, the conductive pillars 12 and 13. In some embodiments, the package body 15 includes an epoxy resin having fillers, a molding compound (e.g., an epoxy molding compound or other molding compound), a polyimide, a phenolic compound or material, a material with a silicone dispersed therein, or a combination thereof.

The circuit layer 16 (also can be a carrier or a substrate) includes an interconnection layer (e.g., redistribution layer, RDL) 16r and a dielectric layer 16d. A portion of the interconnection layer 16r is covered or encapsulated by the dielectric layer 16d while another portion of the interconnection layer 16r is exposed from the dielectric layer 16d to provide electrical connections. In some embodiments, the dielectric layer 16d may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, there may be any number of interconnection layers 16r depending on design specifications. The circuit layer 16 includes a surface 161 on which the package body 15 is disposed and a surface 162 opposite to the surface 161.

The electrical contacts 17 are disposed on the surface 162 of the circuit layer 16 and electrically connected to the interconnection layer 16r to provide electrical connections between the semiconductor device package 1 and other circuits or circuit boards. In some embodiments, the electrical contacts 16 may be or include a controlled collapse chip connection (C4) bump, a micro bump, a solder ball or a copper pillar.

Figure 2:
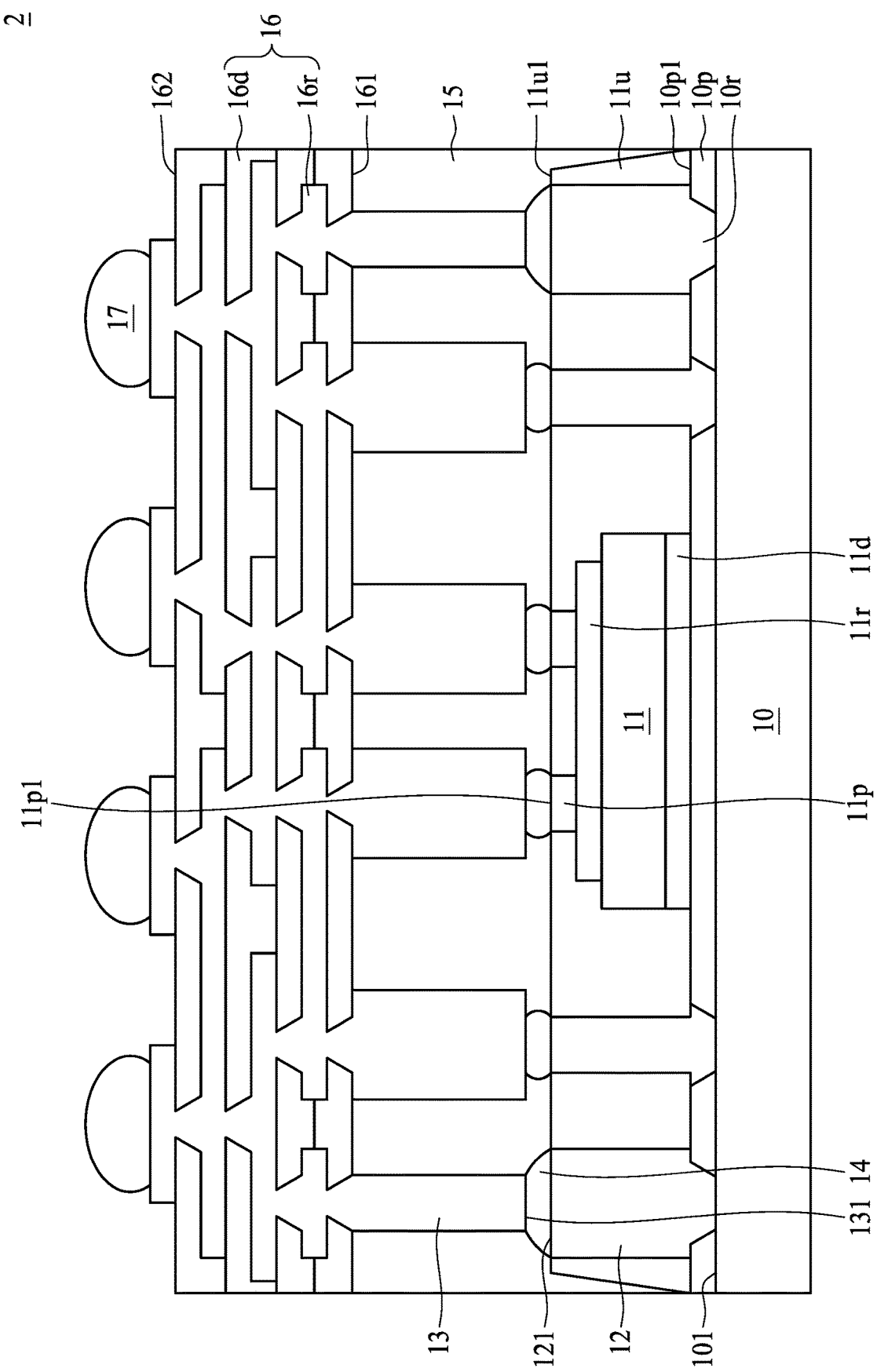
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1 except that the semiconductor device package 2 further includes a RDL 11r. The RDL 11r is disposed on the active surface of the electronic component 11 to provide a fan-out function for the electronic component 11. In some embodiments, the electronic component 11 may include thousands of pins (or terminals), and thus the RDL 11r would facilitate the connections between the electronic component 11 and the electrical contacts 11p.

Figure 3:
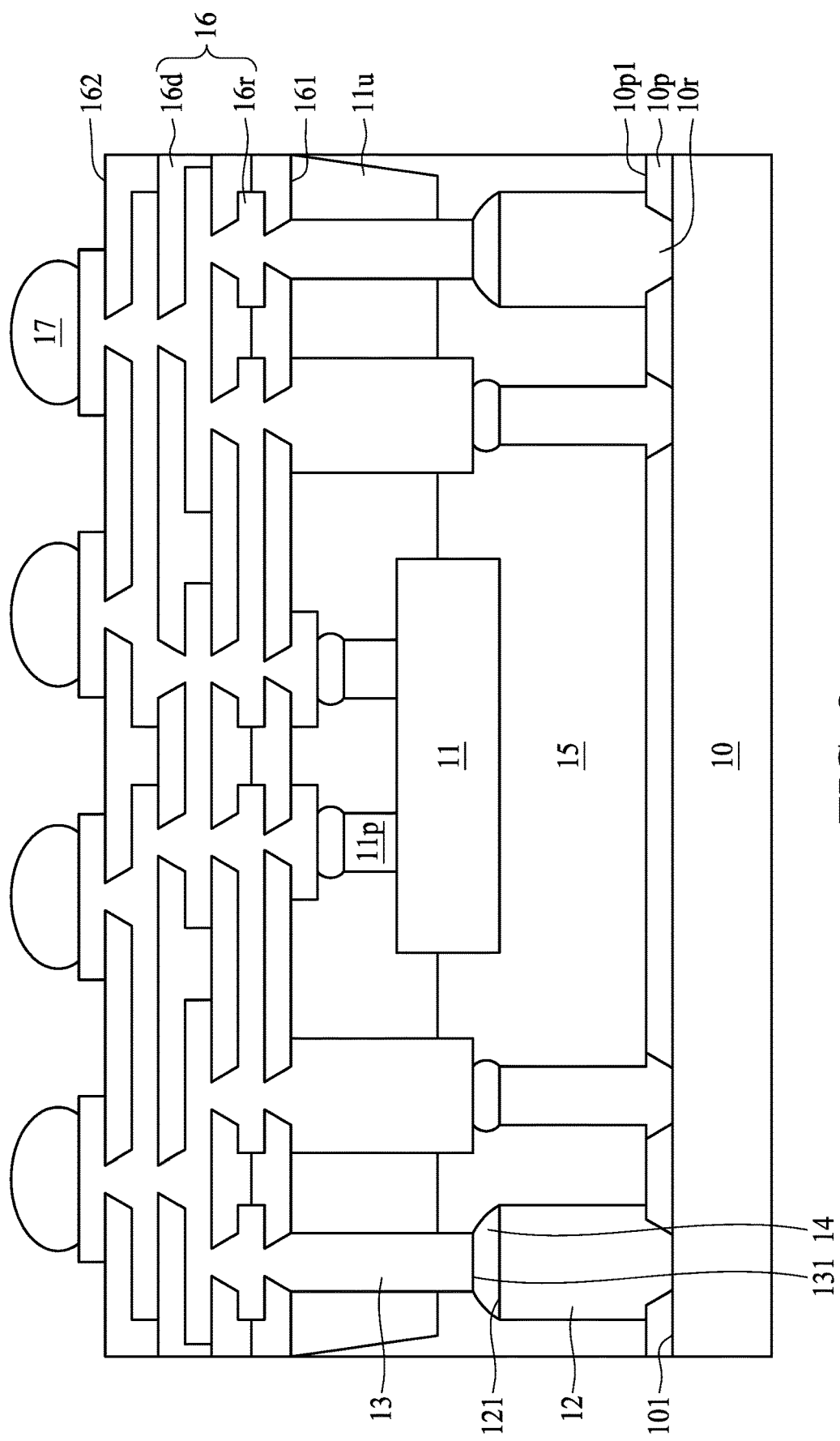
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1, and the differences therebetween are described below.

The electronic component 11 is disposed on the surface 161 of the surface 161 of the circuit layer 16. The active surface of the electronic component 11 faces the circuit layer 16 and electrically connected to the circuit layer 16 (e.g., to the interconnection layer 16r) by flip-chip or other suitable techniques. In some embodiments, the RDL 11r as shown in FIG. 2 (not shown in FIG. 3) may be disposed between the active surface of the electronic component 11 and the electrical contacts 11p.

The underfill 11u is disposed on the surface 161 of the surface 161 of the circuit layer 16 and covers at least a portion of the electronic component 11 (e.g., the active surface) and the conductive pillars 13. The package body 15 covers the underfill 11u, a portion of the electronic component 11 and conductive pillars 13 exposed from the underfill 11u and the conductive pillars 12. In some embodiments, the underfill 11u can be omitted, and the package body 15 directly covers the conductive pillars 12, 13 and the electronic component 11.

Figure 4:
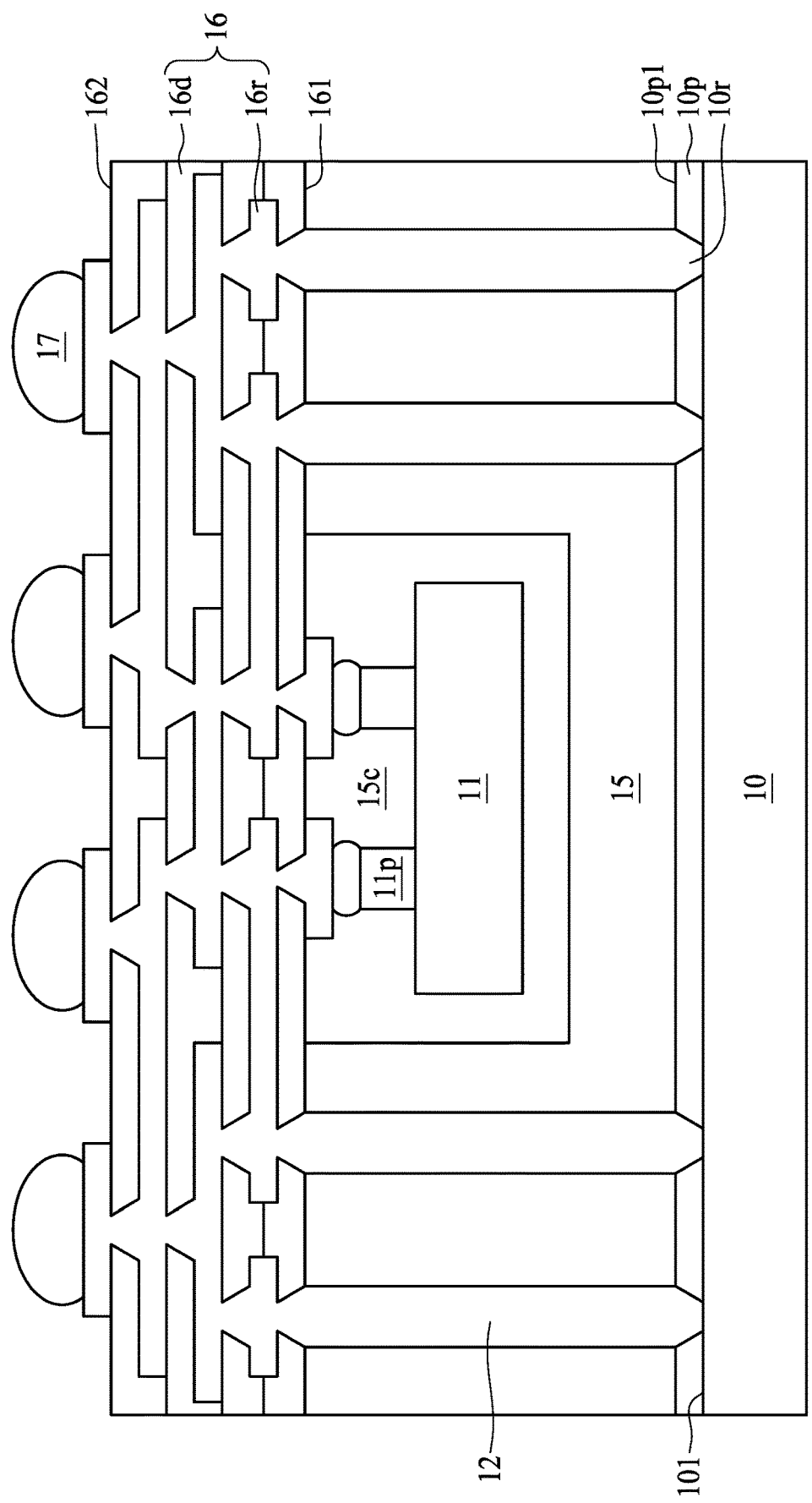
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 in FIG. 3, and the differences therebetween are described below.

The conductive pillars 13 and the connection element 14 are omitted, and the conductive pillars 12 is directly connected between the circuit layer 16 and the conductive layer 10r. For example, the connection between the circuit layer 16 and the conductive layer 10r as shown in FIG. 3 is achieved by two separated conductive pillars (e.g., the conductive pillars 12 and 13) connected by the connection element 14 while in FIG. 4, the connection between the circuit layer 16 and the conductive layer 10r is achieved by a single conductive pillar (e.g., the conductive pillars 12). In other embodiments, the conductive pillar 12 can be replaced by other connection structures, such as solder balls, Cu core balls, solder bumps or other suitable connection structures.

The package body 15 includes a cavity 15c to accommodate the electronic component 11. In some embodiments, the cavity 15c can be filled with another package body. In some embodiments, the package body 15 and the package body filling within the cavity 15c may include the same or different materials depending on different design specifications.

Figure 5A:
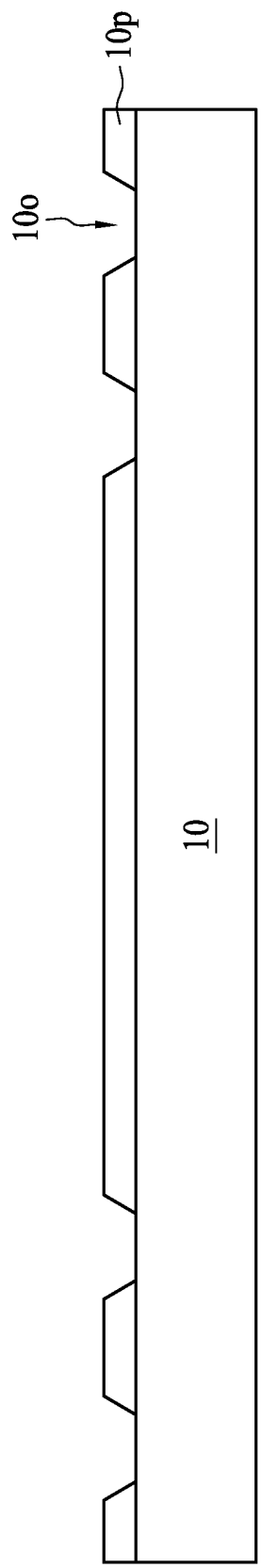
FIG. 5A, FIG. 5B and FIG. 5C illustrate various stages of a method of manufacturing a semiconductor device package in accordance with some embodiments of the present disclosure.
Figure 5B:
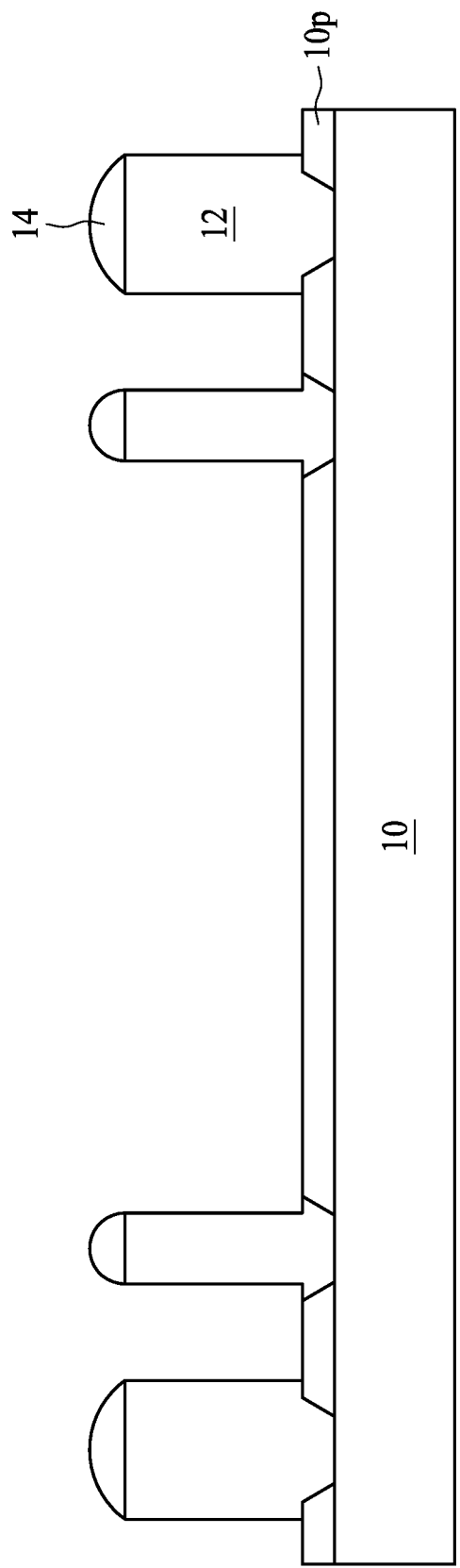
Figure 5C:
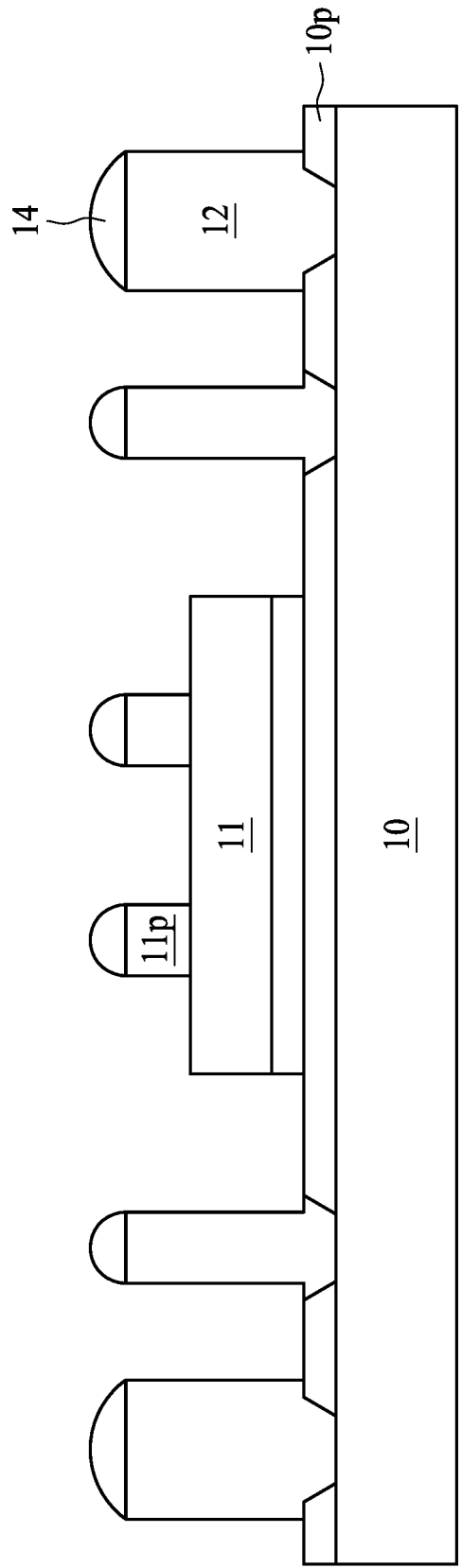

FIG. 5A, FIG. 5B and FIG. 5C are cross-sectional views of a semiconductor structure fabricated at various stages, in accordance with some embodiments of the present disclosure. Various drawings have been simplified for a better understanding of the aspects of the present disclosure. In some embodiments, the operations illustrated in FIG. 5A, FIG. 5B and FIG. 5C can be used to manufacture a portion of the semiconductor device package in FIG. 1. Alternatively, the operations illustrated in FIG. 5A, FIG. 5B and FIG. 5C can be used to manufacture other semiconductor device packages.

Referring to FIG. 5A, a carrier 10 is provided. A passivation layer 10p is formed on the carrier 10. In some embodiments, the passivation layer 10p is patterned to form one or more openings 10o to expose the carrier 10.

Referring to FIG. 5B, a conductive material is disposed or formed within the openings 10o to form the conductive pillars 12. In some embodiments, the conductive material may be formed by, for example, plating or any other suitable processes. In some embodiments, the height of the conductive pillars 12 is less than 200 micrometers.

Referring to FIG. 5C, the electronic component 11 is disposed on the passivation layer 10p. In some embodiments, the back surface of the electronic component 11 is attached to passivation layer 10p through, for example, an adhesive layer (e.g., DAF, ABF, epoxy, sintering or the like).

FIG. 6A, FIG. 6B, FIG. 6C and FIG. 6D are cross-sectional views of a semiconductor structure fabricated at various stages, in accordance with some embodiments of the present disclosure. Various drawings have been simplified for a better understanding of the aspects of the present disclosure. In some embodiments, the operations illustrated in FIG. 6A, FIG. 6B, FIG. 6C and FIG. 6D can be used to manufacture the semiconductor device package 1 in FIG. 1. Alternatively, the operations illustrated in FIG. 6A, FIG. 6B, FIG. 6C and FIG. 6D can be used to manufacture other semiconductor device packages.

Figure 6A:
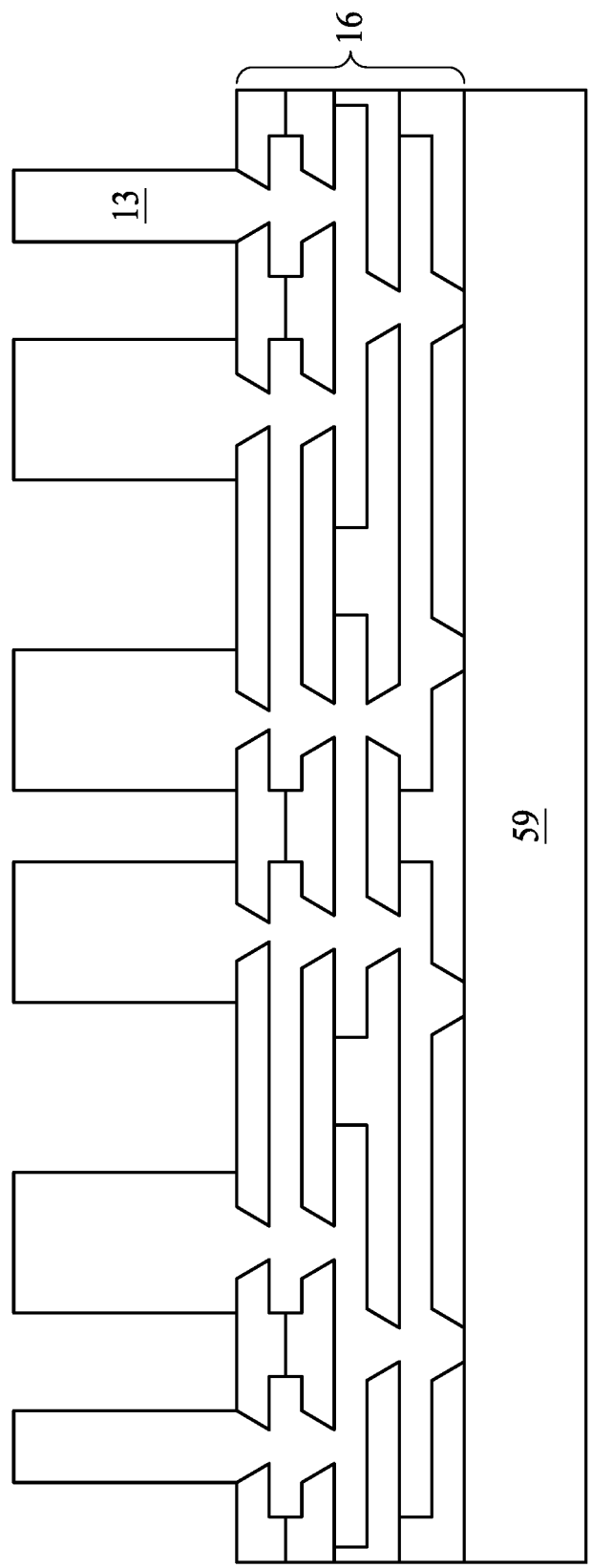
FIG. 6A, FIG. 6B, FIG. 6C and FIG. 6D illustrate various stages of a method of manufacturing a semiconductor device package in accordance with some embodiments of the present disclosure.

Referring to FIG. 6A, a carrier 59 is provided. A circuit layer 16 (including an interconnection layer and a dielectric layer covering a portion of the interconnection layer) is formed on the carrier 59. A conductive material is disposed or formed on the interconnection layer of the circuit layer 16 exposed from the dielectric layer to form the conductive pillars 13. In some embodiments, the conductive material may be formed by, for example, plating or any other suitable processes.

Figure 6B:
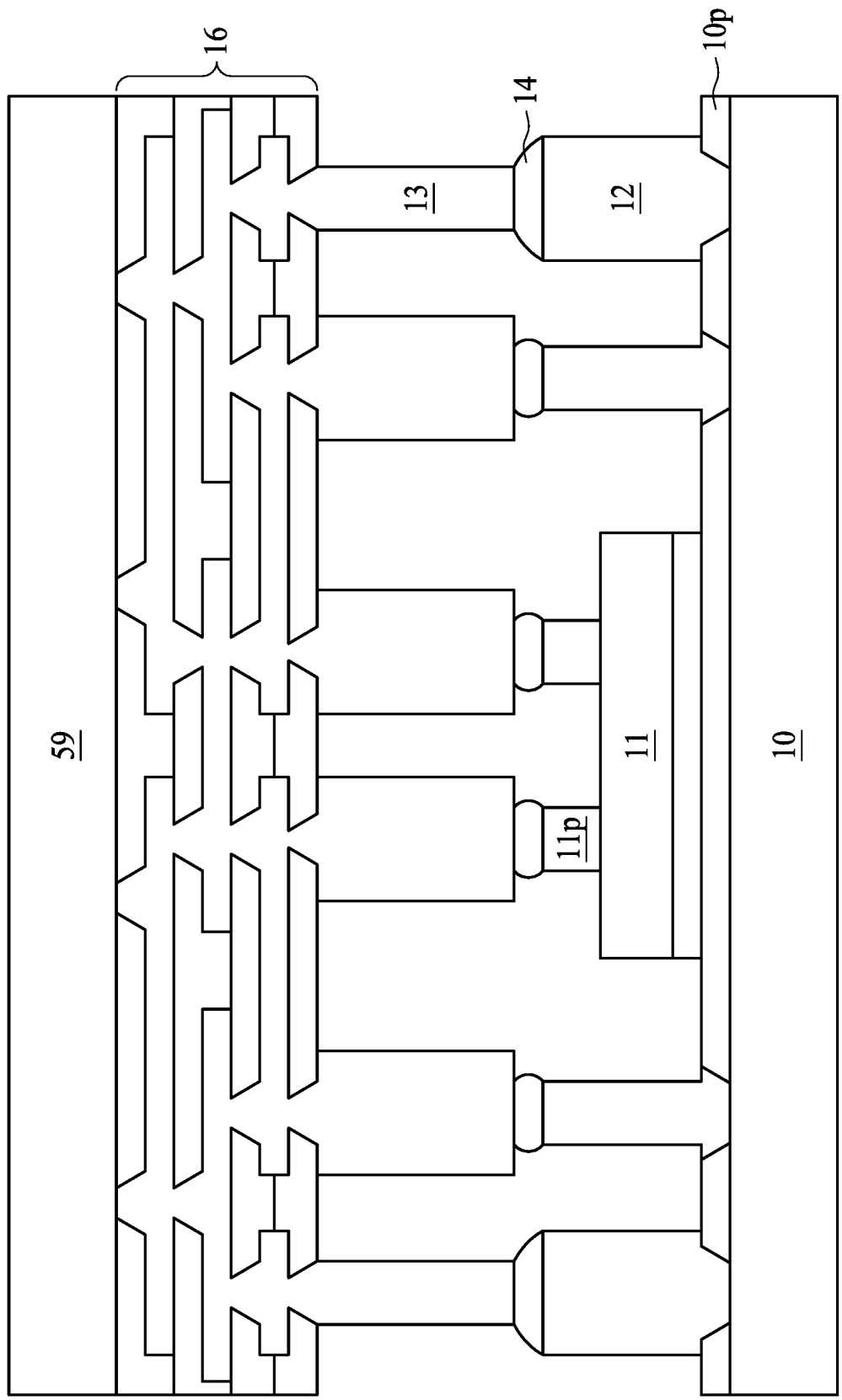

Referring to FIG. 6B, the structure illustrated in FIG. 6A is connected to the structure illustrated in FIG. 5C by, for example, flip-chip bonding or any other suitable techniques. For example, the conductive pillars 13 are aligned with the conductive pillars 12 and connected to the conductive pillars 12 through the connection element 14. Then, a reflow process may be carried out.

Figure 6C:
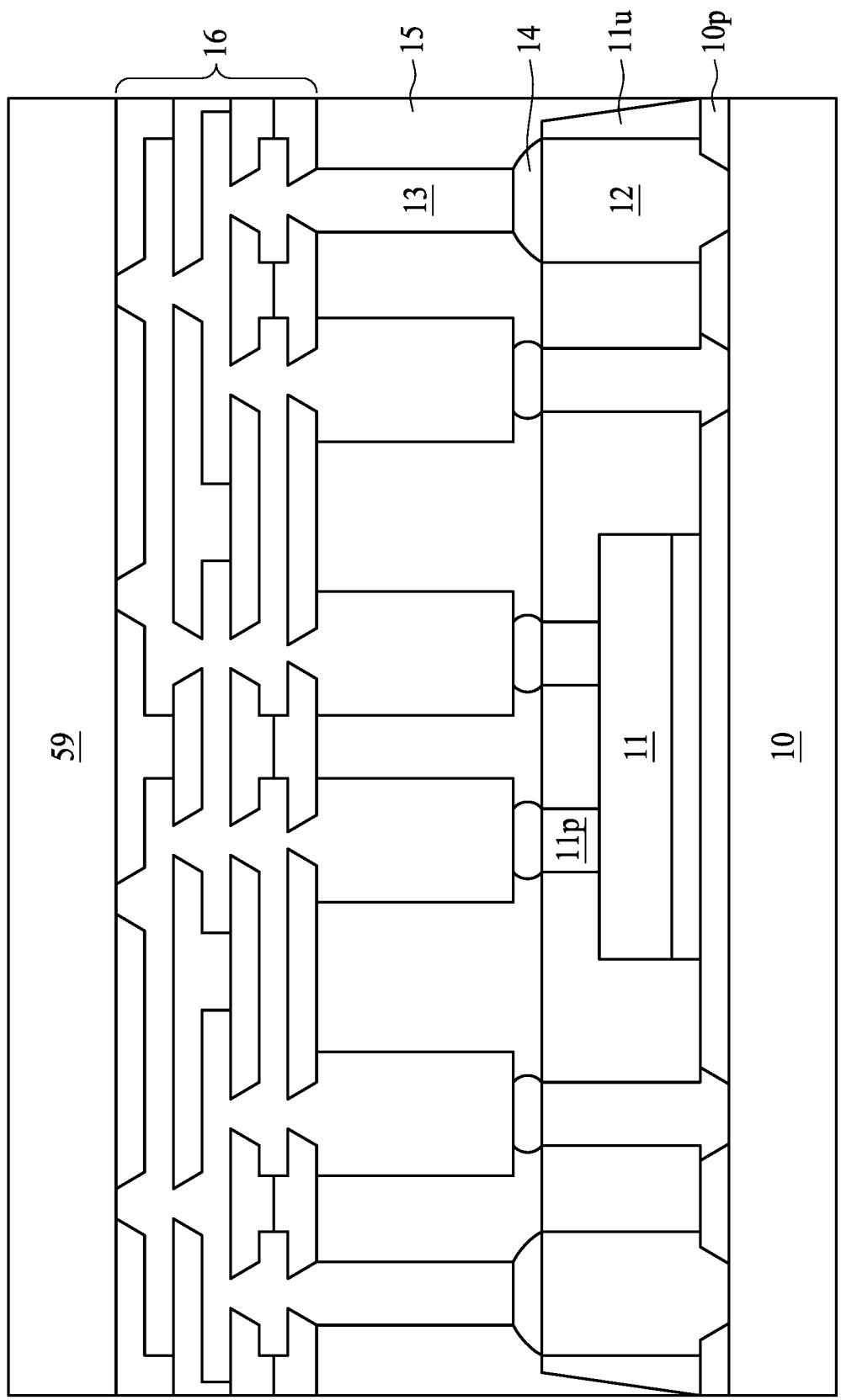

Referring to FIG. 6C, the underfill 11u is formed to cover the electronic component 11 and a portion of the conductive pillars 12. The package body 15 is then formed to cover the underfill 11u and the conductive pillars 13 by, for example, compression molding or other suitable molding techniques. In some embodiments, the formation of the underfill 11u can be omitted, and the package body 15 is directly formed between the passivation layer 10p and the circuit layer 16 to cover the electronic component 11, the conductive pillars 12 and 13.

Figure 6D:
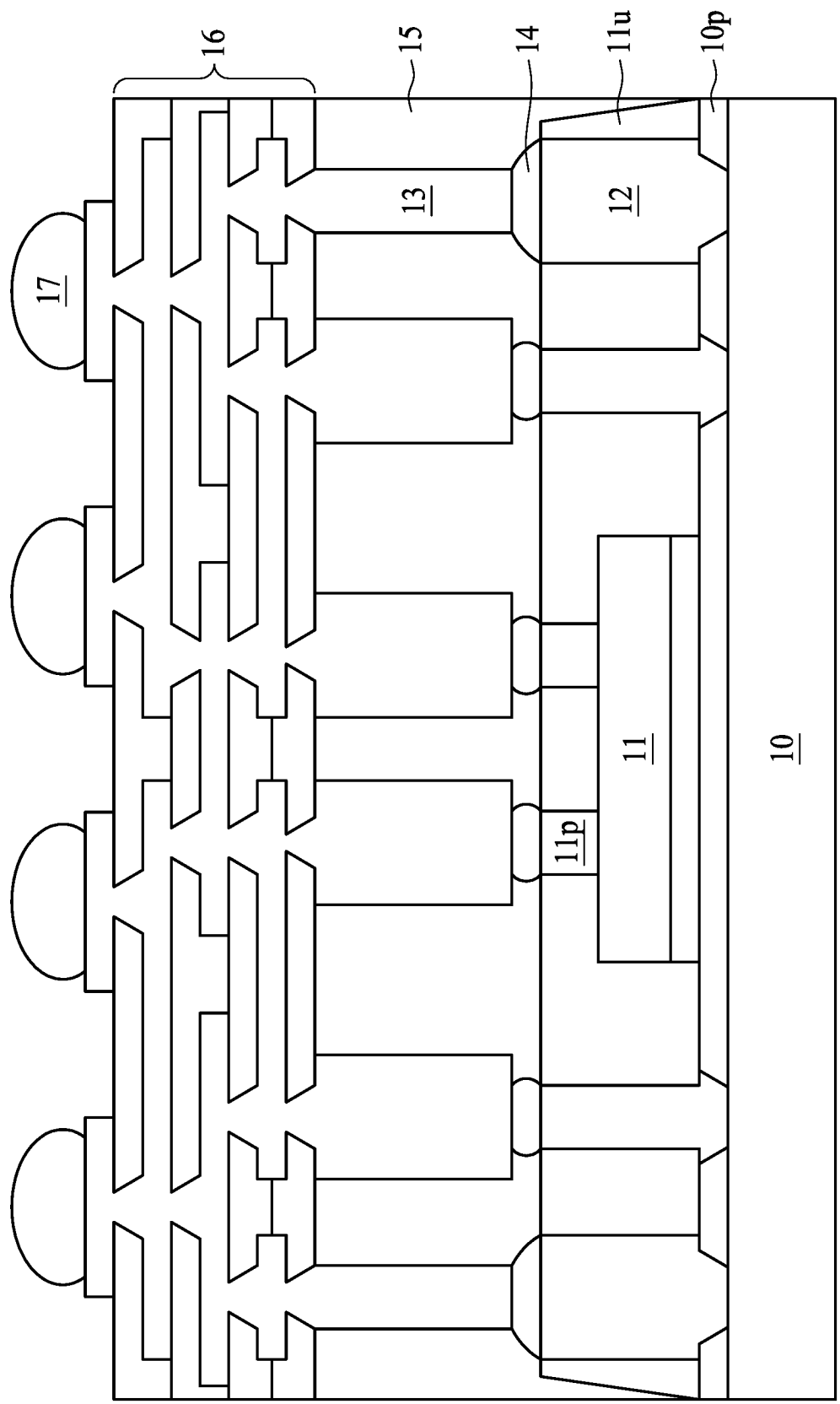

Referring FIG. 6D, the carrier 59 is removed from the circuit layer 16 to expose the circuit layer 16. The electrical contacts 17 are then formed on the interconnection layer of the circuit layer 16 exposed from the dielectric layer to form the semiconductor device package 1 as shown in FIG. 1. In some embodiments, the electrical contacts 17 can be formed by bumping process or any other suitable processes.

In accordance with the embodiments illustrated in FIGS. 5A-5C and 6A-6D, the conductive pillars 12 and 13 are separately formed at different sides (e.g., the conductive pillars 12 are formed on passivation layer 10p and the conductive pillars 13 are formed on the circuit layer 16), and then connected by the connection element 14 to define tall pillars. Thus, it is unnecessary to form a single tall pillar in a one process. In addition, since the package body 15 and/or the underfill 11u are formed to cover the electronic component 11 and conductive pillars 12, 13 after the conductive pillars 12 and 13 have been connected, it is unnecessary to form a molding compound to fully cover the conductive pillars and then removing a portion of the molding compound by grinding to expose the conductive pillars. This would eliminate or reduce the risk for damaging the conductive pillars during the manufacturing process, and reduce the cost, time and complexity for manufacturing the semiconductor device package 1.

In addition, since the structure including the electronic component 11 and the structure including the circuit layer 16 are separately formed in the processes illustrated in FIGS. 5A-5C and FIGS. 6A-6D respectively, this can ensure that the structure including the circuit layer 16 functions well before two structures are connected. This would increase the yield rate for manufacturing the semiconductor device package 1. In some embodiments, the yield rate for manufacturing the semiconductor device package 1 by adopting the operations illustrated in FIGS. 5A-5C and 6A-6D is equal to or greater than 99%.

Figure 7A:
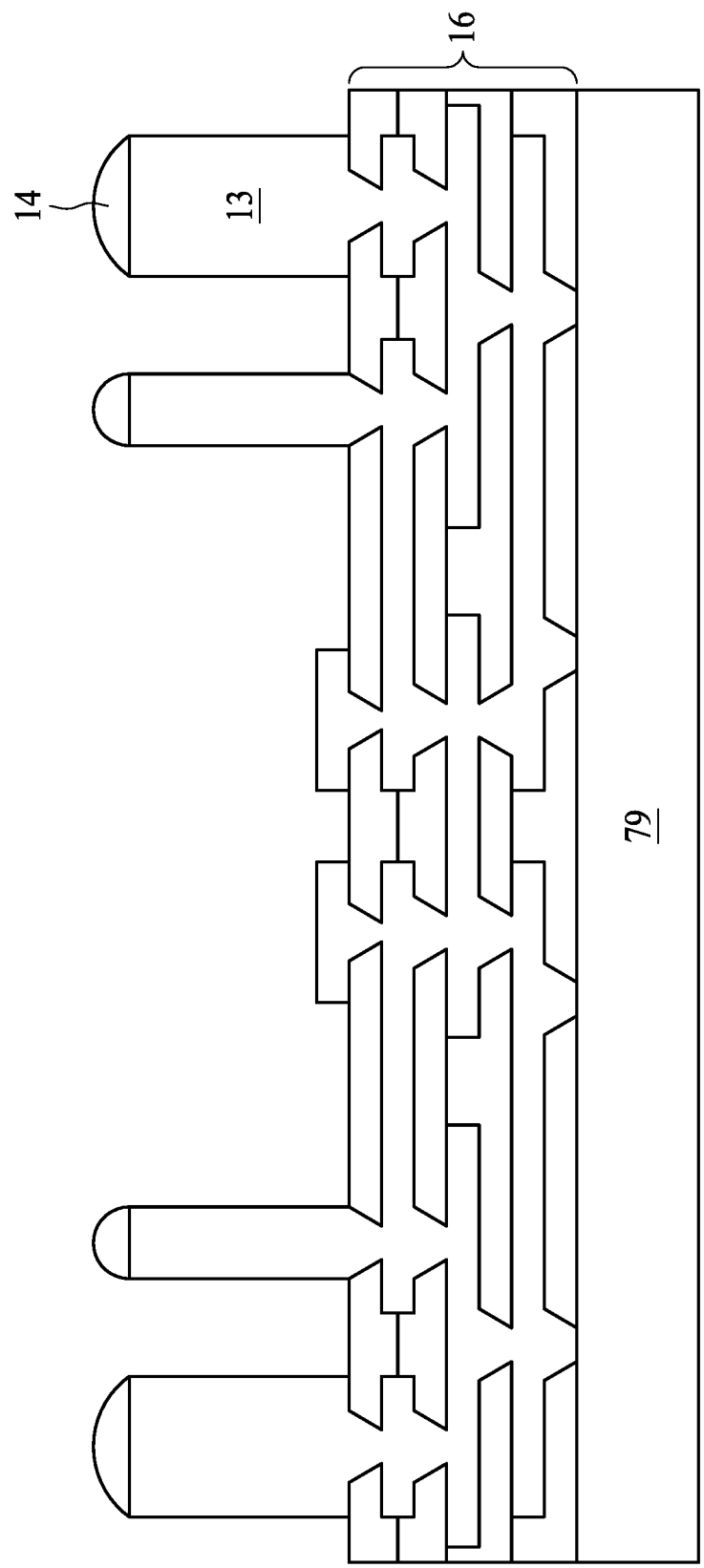
FIG. 7A and FIG. 7B illustrate various stages of a method of manufacturing a semiconductor device package in accordance with some embodiments of the present disclosure.
Figure 7B:
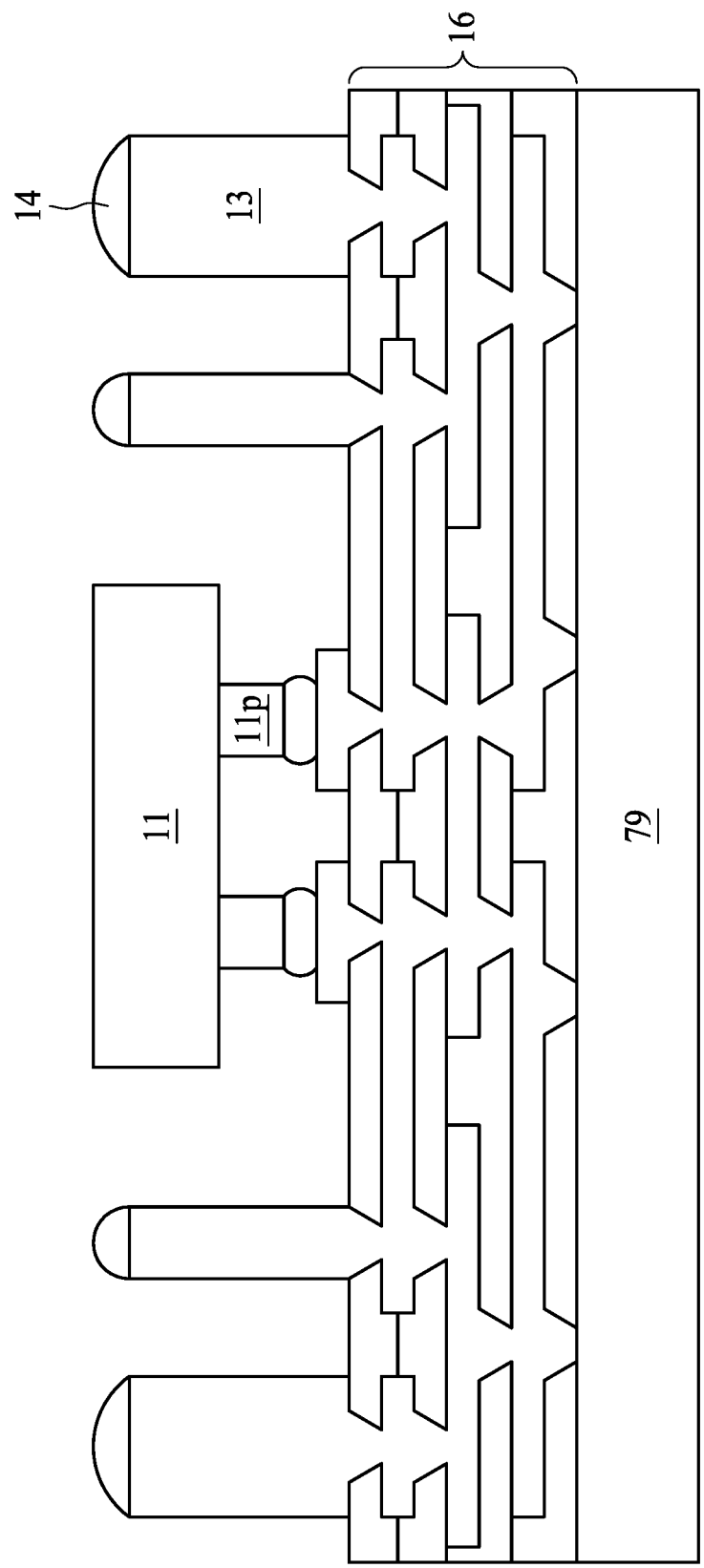

FIG. 7A and FIG. 7B are cross-sectional views of a semiconductor structure fabricated at various stages, in accordance with some embodiments of the present disclosure. Various drawings have been simplified for a better understanding of the aspects of the present disclosure. In some embodiments, the operations illustrated in FIG. 7A and FIG. 7B can be used to manufacture a portion of the semiconductor device package in FIG. 3. Alternatively, the operations illustrated in FIG. 7A and FIG. 7B can be used to manufacture other semiconductor device packages.

The operations illustrated in FIG. 7A and FIG. 7B are similar to those illustrated in FIG. 6B, except that in FIG. 7B, an electronic component 11 is further disposed on the circuit layer 16. The active surface of the electronic component 11 faces the circuit layer 16 and electrically connected to the circuit layer 16 by, for example, flip-chip bonding or any other suitable process.

FIG. 8A, FIG. 8B, FIG. 8C and FIG. 8D are cross-sectional views of a semiconductor structure fabricated at various stages, in accordance with some embodiments of the present disclosure. Various drawings have been simplified for a better understanding of the aspects of the present disclosure. In some embodiments, the operations illustrated in FIG. 8A, FIG. 8B, FIG. 8C and FIG. 8D can be used to manufacture the semiconductor device package 3 in FIG. 3. Alternatively, the operations illustrated in FIG. 8A, FIG. 8B, FIG. 8C and FIG. 8D can be used to manufacture other semiconductor device packages.

Figure 8A:
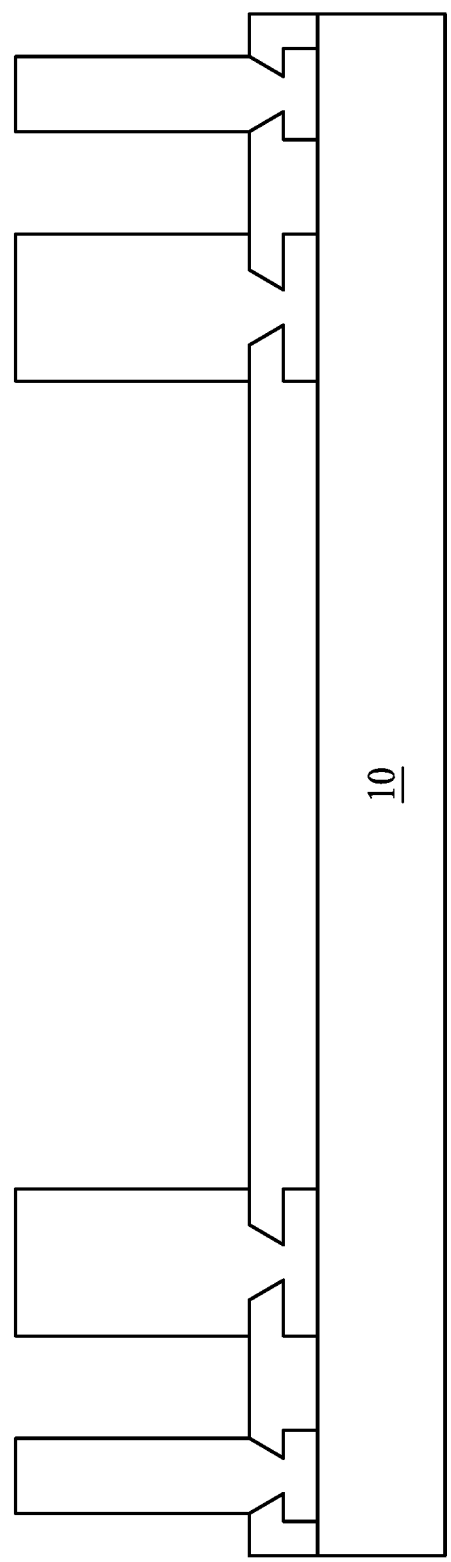
FIG. 8A, FIG. 8B, FIG. 8C and FIG. 8D illustrate various stages of a method of manufacturing a semiconductor device package in accordance with some embodiments of the present disclosure.
Figure 8B:
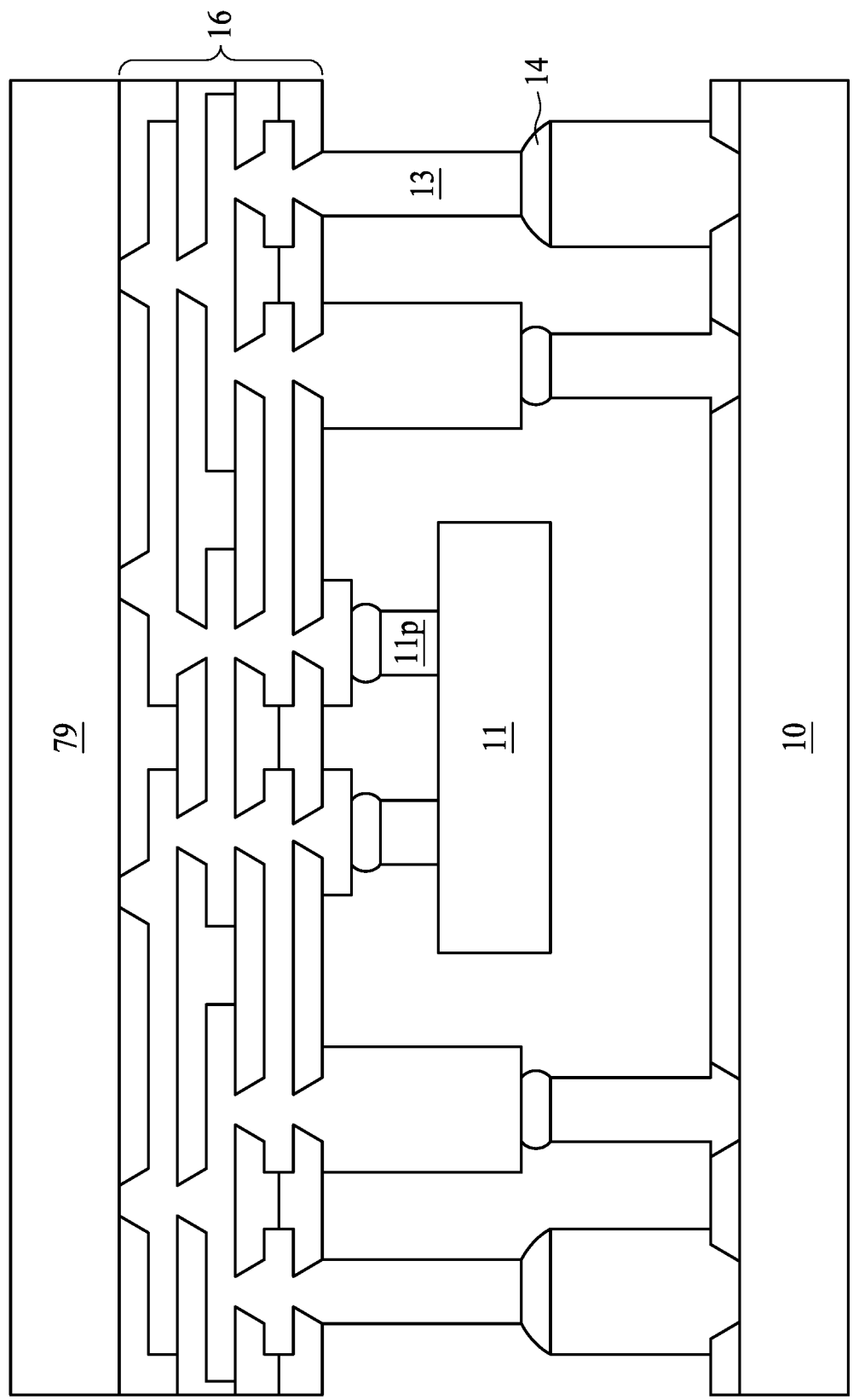
Figure 8C:
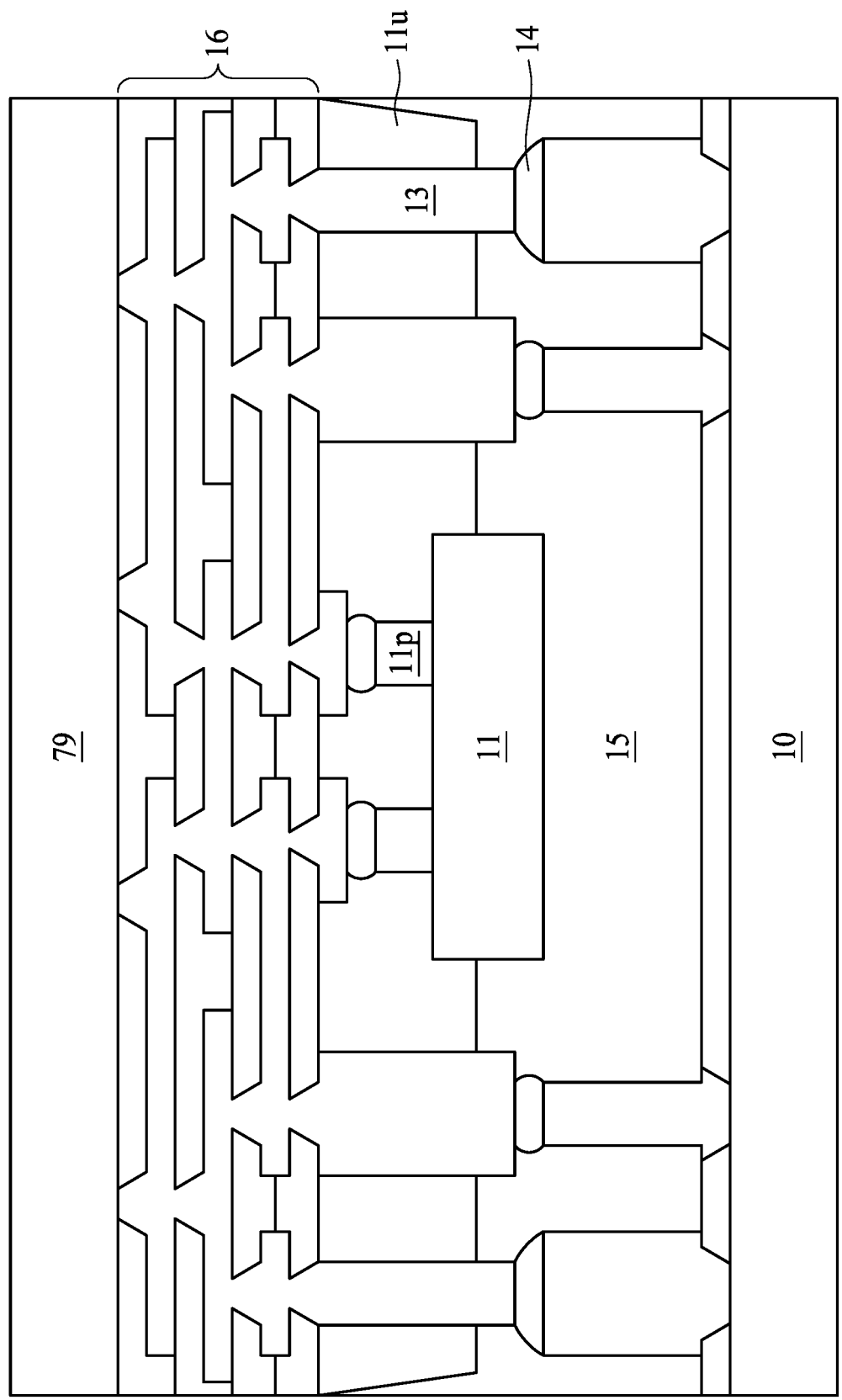
Figure 8D:
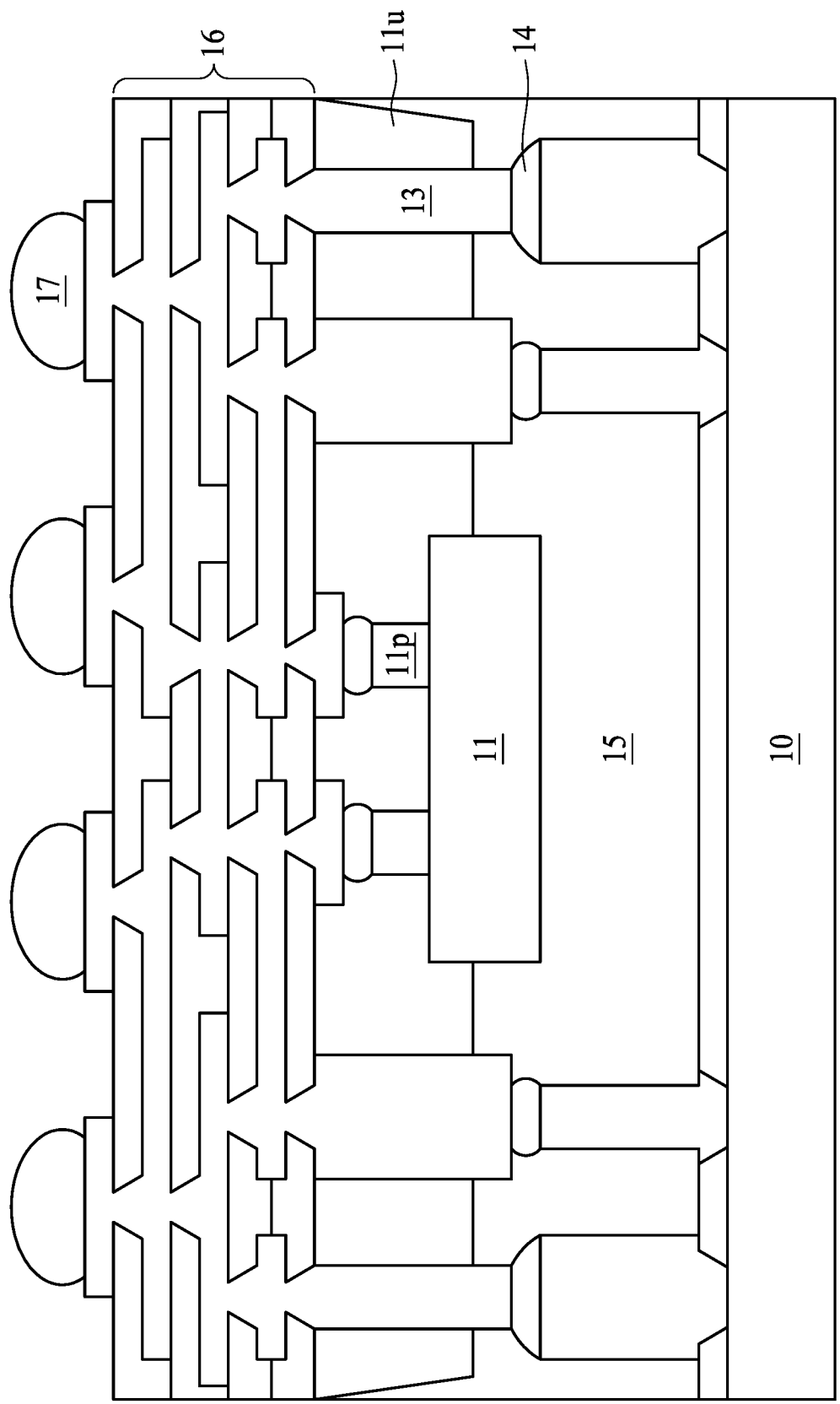

The operations illustrated in FIGS. 8A-8D are similar to those illustrated in FIGS. 6A-6D, and one of the main differences includes that in FIGS. 6A-6D, the structure illustrated in FIG. 6A is connected to the structure illustrated in FIG. 5C while in FIGS. 8A-8D, the structure illustrated in FIG. 8A is connected to the structure illustrated in FIG. 7B. Therefore, the descriptions and advantages of the operations illustrated in FIGS. 6A-6D are applicable to FIGS. 8A-8D.

Figure 9A:
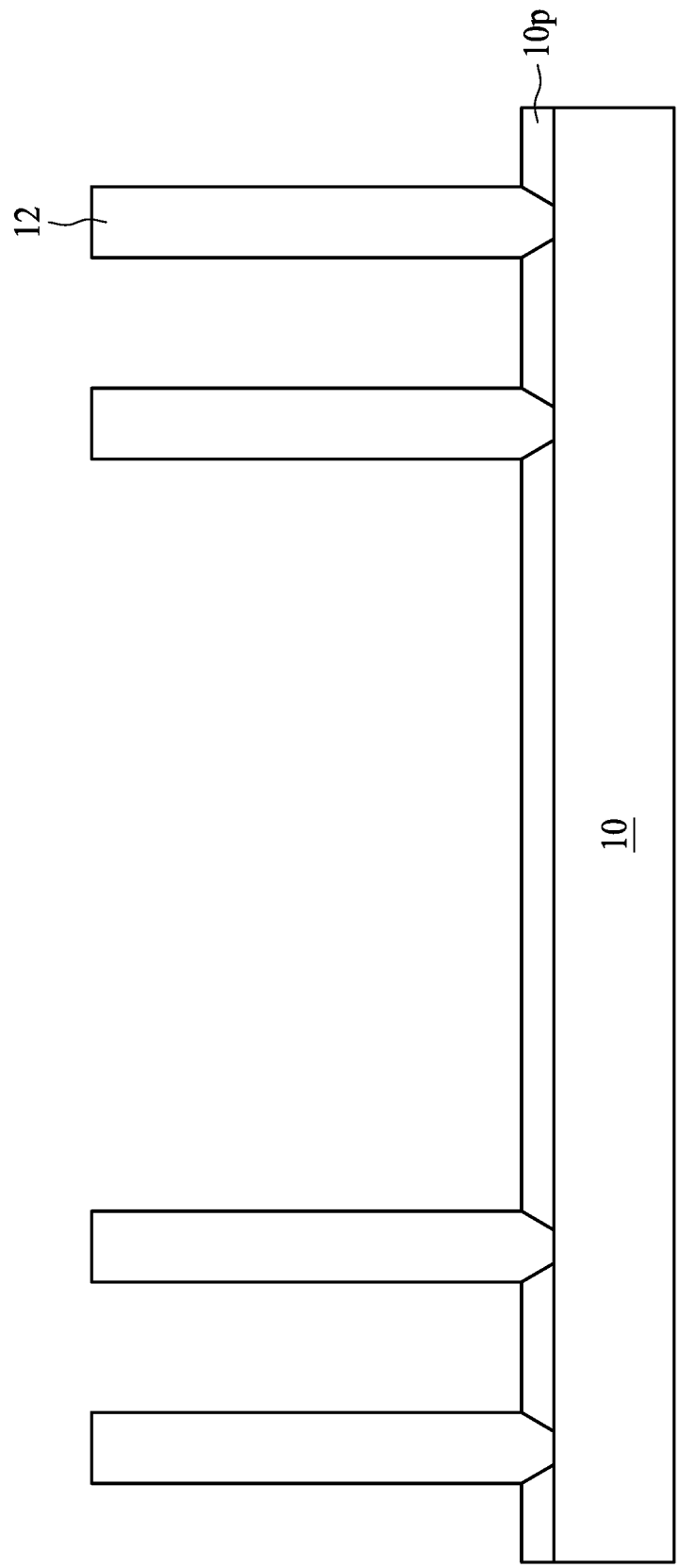
FIG. 9A, FIG. 9B, FIG. 9C and FIG. 9D illustrate various stages of a method of manufacturing a semiconductor device package in accordance with some embodiments of the present disclosure.
Figure 9B:
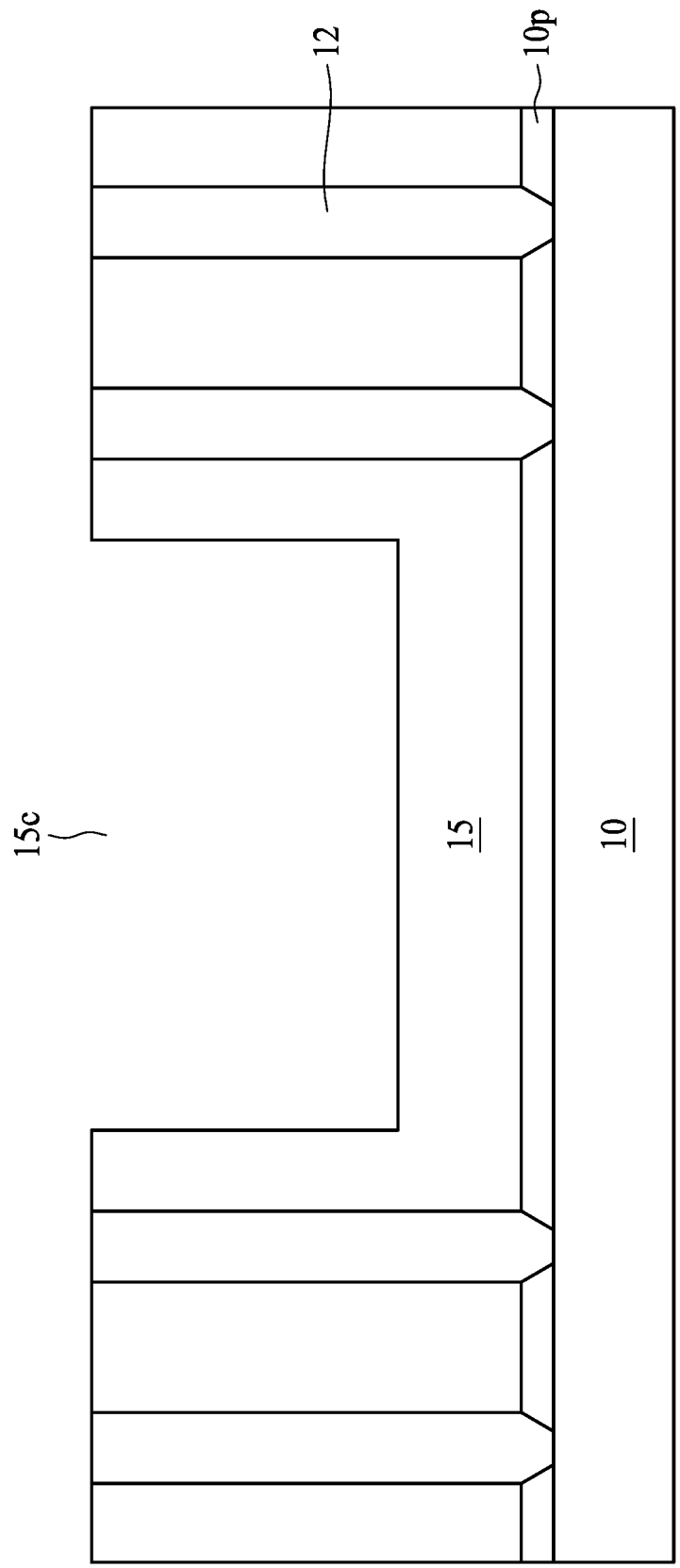
Figure 9C:
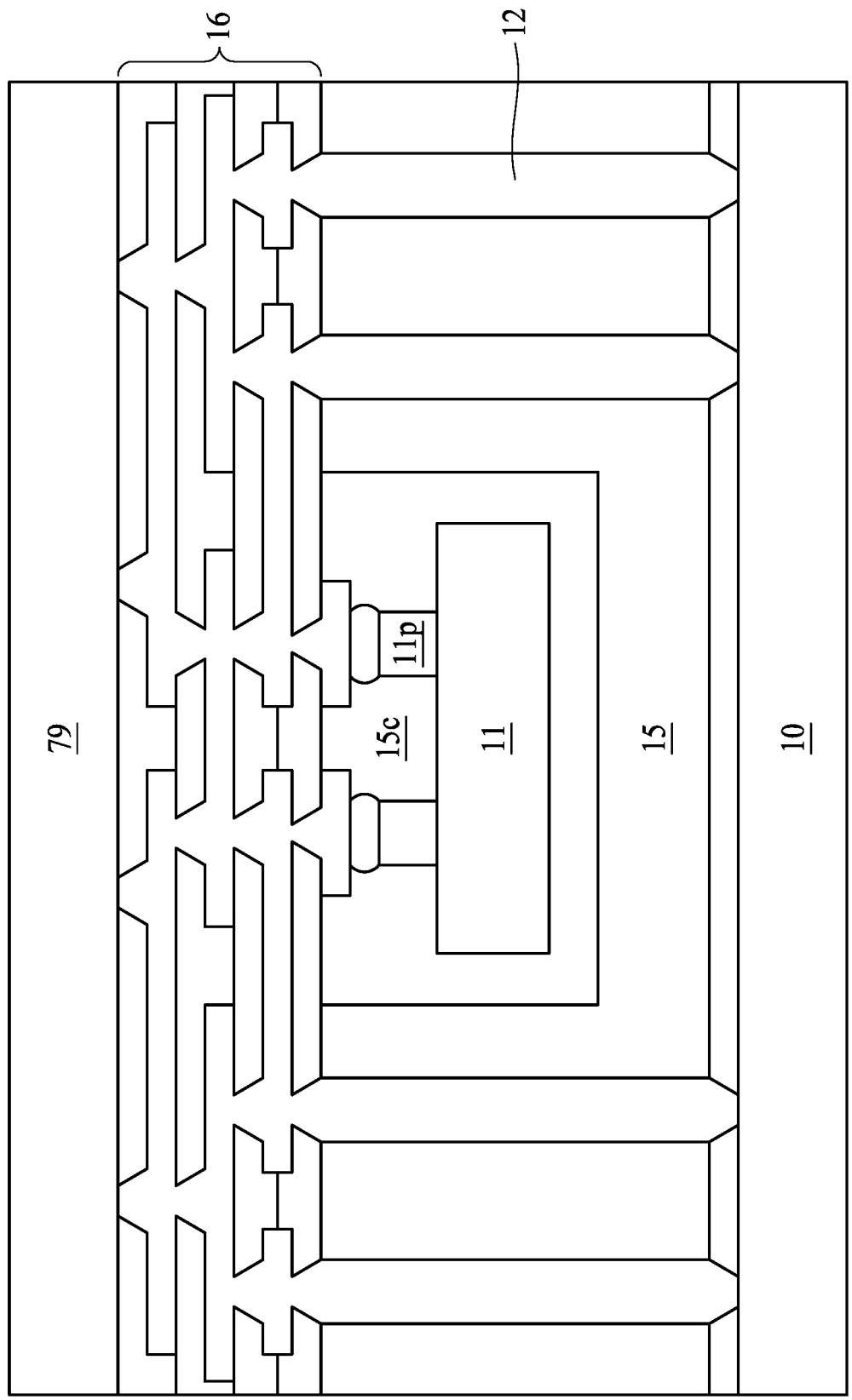

FIG. 9A, FIG. 9B and FIG. 9C are cross-sectional views of a semiconductor structure fabricated at various stages, in accordance with some embodiments of the present disclosure. Various drawings have been simplified for a better understanding of the aspects of the present disclosure. In some embodiments, the operations illustrated in FIG. 9A, FIG. 9B and FIG. 9C can be used to manufacture the semiconductor device package 4 in FIG. 4. Alternatively, the operations illustrated in FIG. 9A, FIG. 9B and FIG. 9C can be used to manufacture other semiconductor device packages.

Referring to FIG. 9A, a carrier 10 is provided. A passivation layer 10p is formed on the carrier 10. In some embodiments, the passivation layer 10p is patterned to form one or more openings to expose the carrier 10. A conductive material is then disposed or formed within the openings to form the conductive pillars 12. In some embodiments, the conductive material may be formed by, for example, plating or any other suitable processes. In some embodiments, the height of the conductive pillars 12 is equal to or greater than 200 micrometers.

Referring to FIG. 9B, a package body 15 is formed on the passivation layer 10p to cover the conductive pillars 12. In some embodiments, the package body 15 is formed by, for example, compression molding, transfer molding or any other suitable processes. A portion of the conductive pillars 12 (e.g., the top surface of the conductive pillars 12) is exposed from the package body 15 for electrical connections.

A cavity 15c is then formed. In some embodiments, the cavity 15c does not penetrate the package body 15. For example, the package body 15 may constitute a bottom surface of the cavity 15c. In other embodiments, the cavity 15c may penetrate the package body 15. For example, the passivation layer 10p constitutes the bottom surface of the cavity 15c. In some embodiments, the cavity 15c may be formed by selective molding. In some embodiments, the cavity 15c may be formed by drilling or etching.

Referring to FIG. 9C, a structure having a circuit layer 16 with an electronic component 11 disposed thereon is provided. The structure may be formed by the operations in FIG. 7B without the formation of the conductive pillars 13 and connection element 14. The structure in FIG. 9B is then disposed on the circuit layer 16 while the electronic component 11 is within the cavity 15c. The portion of the conductive pillars 12 exposed from the package body 15 is electrically connected to the circuit layer 16.

Figure 9D:
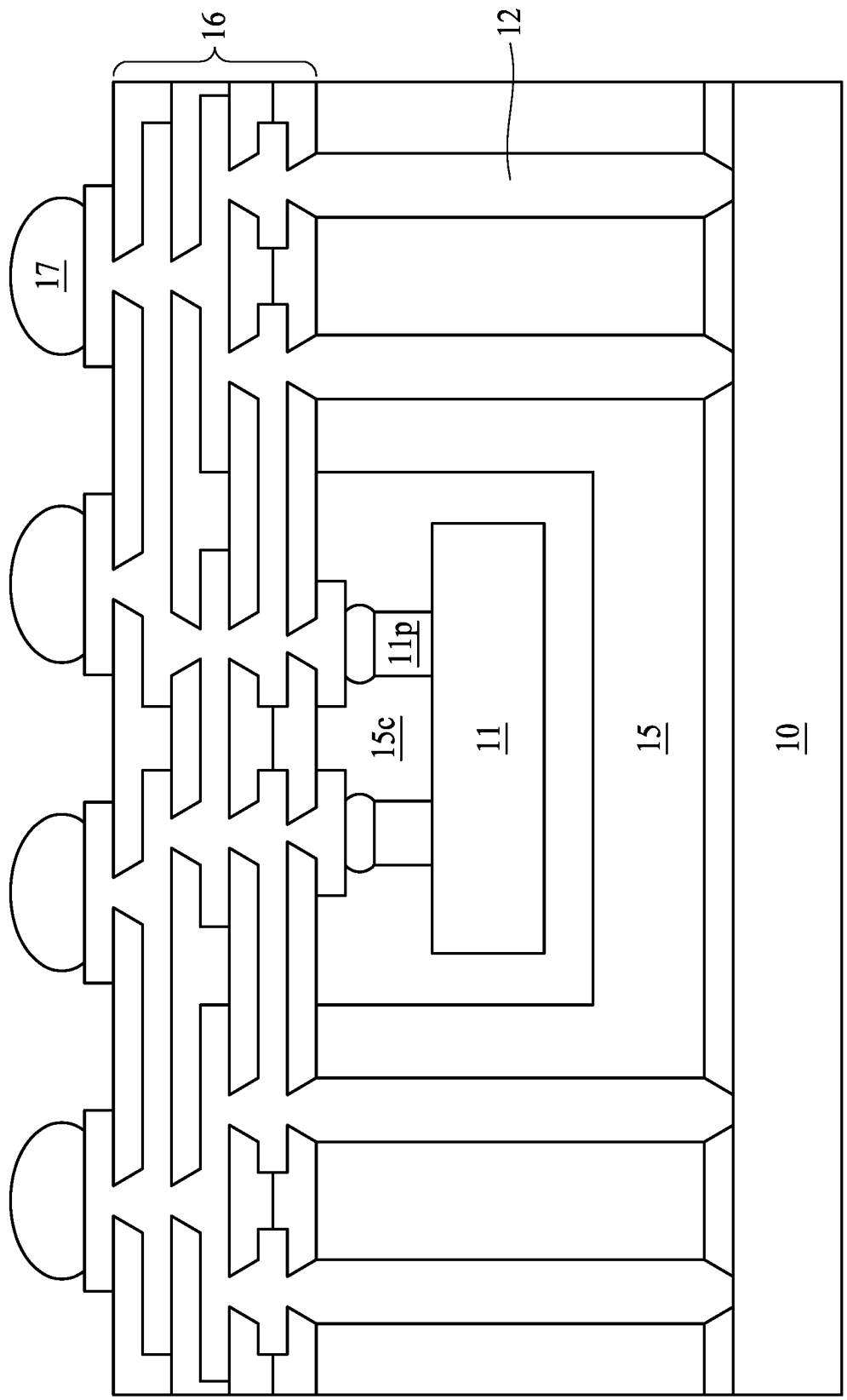

Referring to FIG. 9D, the carrier 79 is removed from the circuit layer 16 to expose the circuit layer 16. The electrical contacts 17 are then formed on the interconnection layer of the circuit layer 16 exposed from the dielectric layer to form the semiconductor device package 4 as shown in FIG. 4. In some embodiments, the electrical contacts 17 can be formed by bumping process or any other suitable processes. 4

In addition, since the structure including the electronic component 11 and the structure including the conductive pillars 12 are separately formed, this can ensure that the structure including the conductive pillars 12 functions well before two structures are connected. This would increase the yield rate for manufacturing the semiconductor device package 4.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a conductive layer having a first surface;
   a first conductive pillar disposed on the first surface of the conductive layer;
   a circuit layer disposed over the conductive layer, the circuit layer having a first surface facing the conductive layer;
   a second conductive pillar disposed on the first surface of the circuit layer;
   a conductive adhesion connecting the first conductive pillar with the second conductive pillar;
   a third conductive pillar disposed on the first surface of the conductive layer; and
   a fourth conductive pillar disposed on the first surface of the circuit layer,
   wherein the first conductive pillar is physically spaced apart from the second conductive pillar and electrically connected to the second conductive pillar, the third conductive pillar is connected to the fourth conductive pillar through the conductive adhesion, and a diameter of the third conductive pillar is different from a diameter of the first conductive pillar and/or a diameter of the fourth conductive pillar is different from a diameter of the second conductive pillar.

2. The semiconductor device package of claim 1, wherein the first conductive pillar has a first surface facing the circuit layer;

the second conductive pillar has a first surface facing the first surface of the first conductive pillar and is aligned with the first surface of the first conductive pillar; and the conductive adhesion connects the first surface of the first conductive pillar with the first surface of the second conductive pillar.

3. The semiconductor device package of claim 1, further comprising an electronic component disposed on the first surface of the conductive layer, wherein the electronic component has an active surface facing the circuit layer.

4. The semiconductor device package of claim 3, further comprising a conductive element disposed on the active surface of the electronic component, wherein a surface of the conductive element facing the circuit layer is substantially coplanar with a surface of the first conductive pillar facing the circuit layer.

5. The semiconductor device package of claim 4, further comprising a redistribution layer disposed between the active surface of the electronic component and the conductive element.

6. The semiconductor device package of claim 4, further comprising a fifth conductive pillar disposed on the first surface of the circuit layer, wherein the fifth conductive layer is connected to the conductive element through the conductive adhesion.

7. The semiconductor device package of claim 4, further comprising:
an underfill covers the electronic component and the first conductive pillar; and
a package body covers the underfill, the second conductive pillar and the conductive adhesion.

8. The semiconductor device package of claim 7, wherein a surface of the underfill facing the circuit layer is substantially coplanar with the surface of the conductive element and the surface of the first conductive pillar.

9. The semiconductor device package of claim 4, further comprising a package body covering the electronic component, the first conductive pillar, the second conductive pillar and the conductive adhesion.

10. The semiconductor device package of claim 1, further comprising an electronic component disposed on the first surface of the circuit layer, wherein the electronic component has an active surface facing the circuit layer and electrically connected to the circuit layer.

11. The semiconductor device package of claim 10, further comprising:
an underfill covers the electronic component and the second conductive pillar; and
a package body covers the underfill, the first conductive pillar and the conductive adhesion.

12. The semiconductor device package of claim 10, further comprising a package body covering the electronic component, the first conductive pillar, the second conductive pillar and the conductive adhesion.

13. A method for manufacturing a semiconductor device package, comprising:
(a) providing a first structure having a conductive layer and a first conductive pillar disposed on the conductive layer, wherein operation (a) further comprises attaching a backside surface of an electronic component to the conductive layer;
(b) providing a second structure having a circuit layer and a second conductive pillar disposed on the circuit layer, wherein the second structure further comprises a third conductive pillar disposed on the circuit layer and electrically connected to an active surface of the electronic component; and
(c) connecting the first conductive pillar with the second conductive pillar through a conductive adhesion; and
(d) forming a package body between the first structure and the second structure to cover the electronic component, the first conductive pillar, the second conductive pillar and the conductive adhesion.

14. The method of claim 13, wherein
the first conductive pillar has a first surface facing the circuit layer;
the second conductive pillar has a first surface facing the first surface of the first conductive pillar and is aligned with the first surface of the first conductive pillar; and
the conductive adhesion connects the first surface of the first conductive pillar with the first surface of the second conductive pillar.

15. The method of claim 13, wherein operation (c) is carried out by flip-chip technique.

16. The method of claim 13, further comprising:
forming an underfill to cover the electronic component and the first conductive pillar,
wherein the package body covers the underfill.

* * * * *